(12) United States Patent
Sakaguchi et al.

(10) Patent No.: US 9,893,655 B2
(45) Date of Patent: Feb. 13, 2018

(54) PIEZOELECTRIC POWER GENERATION APPARATUS

(71) Applicant: MURATA MANUFACTURING CO., LTD., Nagaokakyo-shi, Kyoto-Fu (JP)

(72) Inventors: Hitoshi Sakaguchi, Nagaokakyo (JP); Chikahiro Horiguchi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 464 days.

(21) Appl. No.: 14/611,528

(22) Filed: Feb. 2, 2015

(65) Prior Publication Data

US 2015/0145375 A1 May 28, 2015

Related U.S. Application Data

(63) Continuation of application No. PCT/JP2013/069099, filed on Jul. 12, 2013.

(30) Foreign Application Priority Data

Aug. 7, 2012 (JP) ................. 2012-174612

(51) Int. Cl.
*H02N 2/18* (2006.01)
*H01L 41/113* (2006.01)

(52) U.S. Cl.
CPC ......... *H02N 2/188* (2013.01); *H01L 41/1136* (2013.01); *H02N 2/186* (2013.01)

(58) Field of Classification Search
CPC . G01P 15/0922; G01P 15/0907; H02N 2/188; H02N 2/186; H01L 41/1136

(Continued)

(56) References Cited

U.S. PATENT DOCUMENTS 8,736,148 B2 * 5/2014 Penn .................. H02N 2/103
310/339
8,749,121 B2 6/2014 Fujimoto
(Continued)

FOREIGN PATENT DOCUMENTS

CN 101741278 A 6/2010
JP 2010-246365 A 10/2010
(Continued)

OTHER PUBLICATIONS

English Translation of JP5705440 (also JP application 2010246365).*

(Continued)

*Primary Examiner* — Shawki S Ismail
*Assistant Examiner* — Bryan Gordon
(74) *Attorney, Agent, or Firm* — Arent Fox LLP

(57) ABSTRACT

A piezoelectric power generation apparatus that includes a first vibrating portion having a fixed end and a free end, a first weight portion bonded to the free end of the first vibrating portion, a second vibrating portion having a fixed end bonded to the first weight portion and a free end, and including a vibrating plate and a piezoelectric element provided on the vibrating plate. A second weight portion is bonded to the free end of the second weight portion. In a state where the piezoelectric power generation apparatus is arranged on a vibration surface and is still, a position of the free end of the first vibrating portion and a position of the fixed end of the second vibrating portion in an axial direction perpendicular to the vibration surface are different from each other.

6 Claims, 9 Drawing Sheets

(58) Field of Classification Search
USPC .......................... 310/329, 330, 331, 332, 339
See application file for complete search history.

(56) References Cited

U.S. PATENT DOCUMENTS

| | | | | |
|---|---|---|---|---|
| 2007/0257491 | A1* | 11/2007 | Kornbluh ............ | F03B 13/1845 290/53 |
| 2012/0319532 | A1* | 12/2012 | Formosa ............. | H01L 41/1134 310/329 |
| 2013/0320807 | A1* | 12/2013 | Sakaguchi ............ | H02N 2/188 310/339 |
| 2013/0328446 | A1* | 12/2013 | Horiguchi ........... | H01L 41/1136 310/329 |

FOREIGN PATENT DOCUMENTS

| | | |
|---|---|---|
| JP | 2011-114884 A | 6/2011 |
| WO | WO-2012/07365 A1 | 6/2012 |

OTHER PUBLICATIONS

PCT/JP2013/069099 Written Opinion dated Aug. 22, 2013.
PCT/JP2013/069099 ISR dated Aug. 22, 2013.

\* cited by examiner

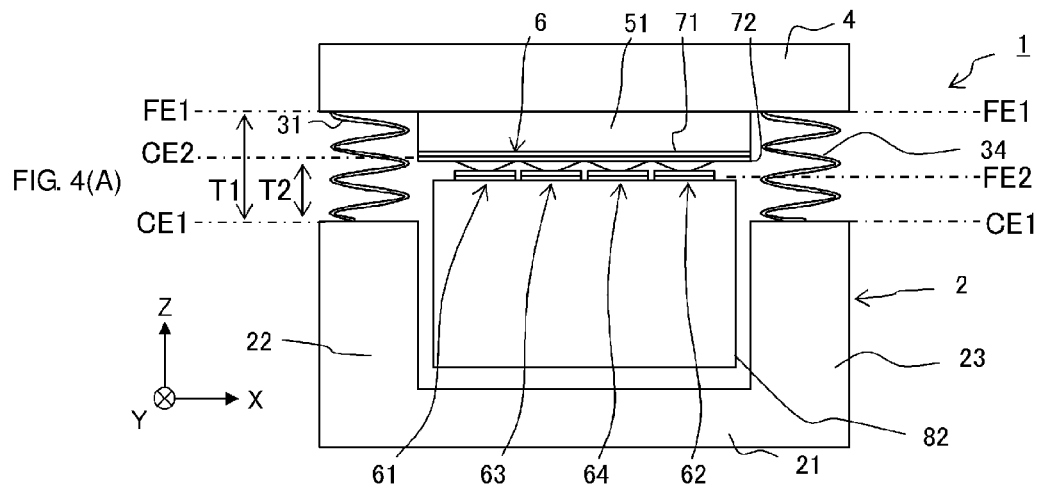
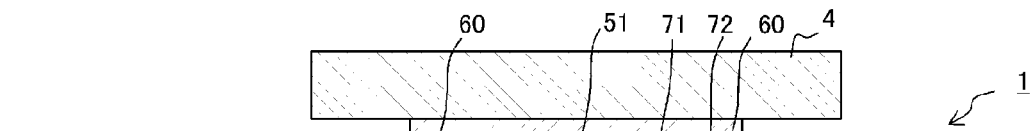
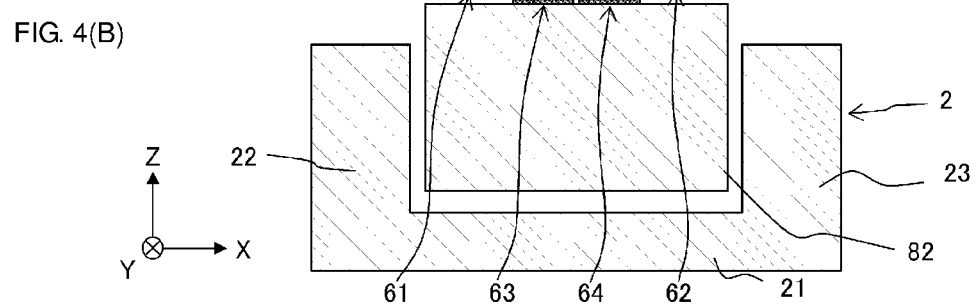
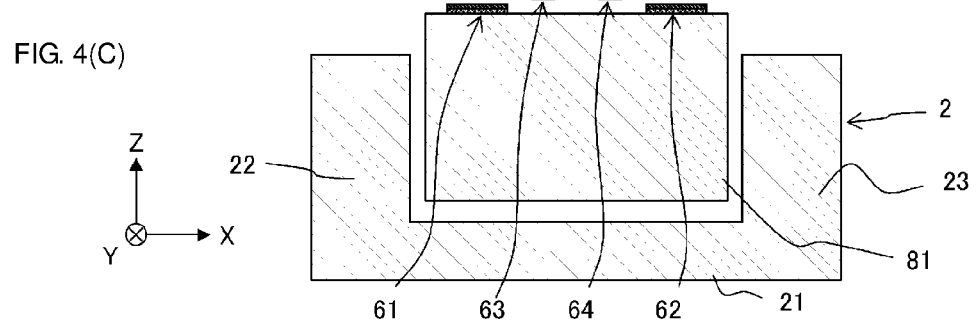

PIEZOELECTRIC POWER GENERATION APPARATUS

CROSS REFERENCE TO RELATED APPLICATIONS

The present application is a continuation of International application No. PCT/JP2013/069099, filed Jul. 12, 2013, which claims priority to Japanese Patent Application No. 2012-174612, filed Aug. 7, 2012, the entire contents of each of which are incorporated herein by reference.

FIELD OF THE INVENTION

The present invention relates to a piezoelectric power generation apparatus that converts vibration energy into electric energy using a piezoelectric effect.

BACKGROUND OF THE INVENTION

An existing piezoelectric power generation apparatus that generates electric power using a piezoelectric element has been proposed (for example, see paragraphs 0078 to 0080 and FIG. 12(a) in Patent Document 1).

FIG. 10 is a view for explaining an example of the configuration of an existing piezoelectric power generation apparatus 101 by reference to description in Patent Document 1 and is a side view in a state where a part of the configuration of the piezoelectric power generation apparatus 101 is excluded.

The piezoelectric power generation apparatus 101 as illustrated in FIG. 10 includes a pedestal 111, a coil spring 112, a rocking member 113, a first weight 114, a piezoelectric element 121, and a second weight 122. The pedestal 111 is formed into a disc-like shape and is fixed to a floor slab 131 as a vibrating body. One end of the coil spring 112 is jointed to the pedestal 111 and the other end thereof is jointed to the disc-like shape rocking member 113. The coil spring 112 supports the rocking member 113 on the pedestal 111 in a rockable manner. The first weight 114 is jointed to a lower portion of the rocking member 113. The piezoelectric element 121 is jointed to the rocking member 113 through the first weight 114. The second weight 122 is jointed to the first weight 114 through the piezoelectric element 121. The second weight 122, the piezoelectric element 121, and the first weight 114 are arranged at the inner side of winding of the coil spring 112. An electrode 121A is provided on a contact surface of the piezoelectric element 121 with the first weight 114. An electrode 121B is provided on a contact surface of the piezoelectric element 121 with the second weight 122.

When vibration in the direction perpendicular to the flat surface of the floor slab 131 is generated on the floor slab 131 with force such as external vibration, the vibration is transmitted to the rocking member 113 through the pedestal 111 and the coil spring 112, and the first weight 114 jointed to the rocking member 113 vibrates. Then, the vibration is transmitted to the second weight 122 through the piezoelectric element 121 and the second weight 122 also vibrates. In this case, compression stress and tensile stress repeatedly act on the piezoelectric element 121 from the first weight 114 and the second weight 122, and electric charges are generated on the piezoelectric element 121 with a piezoelectric effect. The generated electric charges are extracted through the electrodes 121A and 121B provided on the piezoelectric element 121.

Patent Document 1: Japanese Unexamined Patent Application Publication No. 2011-114884

SUMMARY OF THE INVENTION

When vibration in the direction perpendicular to the flat surface of the floor slab 131 is generated on the floor slab 131 with force such as external vibration, it is desired that only longitudinal vibration (hereinafter, also referred to as main vibration) as vibration in the direction perpendicular to the flat surface of the floor slab 131 is generated on the first weight 114 and the second weight 122 of the piezoelectric power generation apparatus 101. However, not only the main vibration but also sub vibration (hereinafter, also referred to as lateral vibration) in the direction orthogonal to the direction of the main vibration (longitudinal vibration) are generated on the first weight 114 and the second weight 122 by influence of torque and the like acting on the respective components actually. Due to this, when the sub vibration which is generated on the first weight 114 and the second weight 122 is larger, the main vibration which is generated on the first weight 114 and the second weight 122 becomes smaller for the sub vibration. This arises a risk that power generation efficiency of the piezoelectric power generation apparatus 101 is lowered.

The present invention provides a piezoelectric power generation apparatus capable of adjusting sub vibration which is generated in the direction orthogonal to the direction of the main vibration which is used for power generation on a piezoelectric element and preventing lowering of power generation efficiency, which is caused by the generation of the sub vibration.

A piezoelectric power generation apparatus according to an aspect of the invention includes a first vibrating portion, a first weight portion, a second vibrating portion, and a second weight portion. The first vibrating portion has a fixed end and a free end. The first weight portion is joined to the free end of the first vibrating portion. The second vibrating portion has a fixed end joined to the first weight portion and a free end. The second vibrating portion includes a vibrating plate and a piezoelectric element provided on the vibrating plate. The second weight portion is joined to the free end of the second vibrating portion. In a state where the piezoelectric power generation apparatus is arranged on a vibration surface and is still, a position of the free end of the first vibrating portion and a position of the fixed end of the second vibrating portion in an axial direction perpendicular to the vibration surface are different while setting the vibration surface as a reference.

Further, in the above-mentioned piezoelectric power generation apparatus, it is preferable that in the state where the piezoelectric power generation apparatus is arranged on the vibration surface and is still, the position of the fixed end of the second vibrating portion rather than the position of the free end of the first vibrating portion be closer to a position of the fixed end of the first vibrating portion in the axial direction perpendicular to the vibration surface while setting the vibration surface as a reference.

In the above-mentioned piezoelectric power generation apparatus, it is preferable that in the state where the piezoelectric power generation apparatus is arranged on the vibration surface and is still, when a distance between the position of the fixed end of the first vibrating portion and the position of the free end of the first vibrating portion is assumed to be T1 and a distance between the position of the fixed end of the first vibrating portion and the position of the fixed end of the second vibrating portion is assumed to be T2 in the axial direction perpendicular to the vibration surface while setting the vibration surface as a reference, a relation of $-2.1<(T2-T1)/T1<-0.1$ be satisfied.

In addition, in the above-mentioned piezoelectric power generation apparatus, it is preferable that the first weight portion be configured by a weight plate to which the free end of the first vibrating portion is joined and first and second fixing portions provided on a surface of the weight plate to which the free end of the first vibrating portion is joined, a pair of the second vibrating portion and the second weight portion, which are joined to the first fixing portion, and a pair of the second vibrating portion and the second weight portion, which are joined to the second fixing portion, be provided, a part of the second weight portion in the pair joined to the first fixing portion be located at a lower side of the second fixing portion, and a part of the second weight portion in the pair joined to the second fixing portion be located at a lower side of the first fixing portion.

According to the present invention, magnitudes of main vibration and sub vibration which are generated on the second vibrating portion can be adjusted. Therefore, the sub vibration which is generated on the second vibrating portion is suppressed, thereby improving lowering of power generation efficiency, which is caused by the sub vibration, so as to enhance the power generation efficiency.

BRIEF DESCRIPTION OF THE DRAWINGS

FIGS. 4(A) to 4(C) show a side view and cross-sectional views illustrating the piezoelectric power generation apparatus according to the first embodiment of the invention.

DETAILED DESCRIPTION OF THE PREFERRED EMBODIMENTS

The configuration of a piezoelectric power generation apparatus 1 according to a first embodiment of the invention is described with reference to FIGS. 1 to 6.

Figure 1:
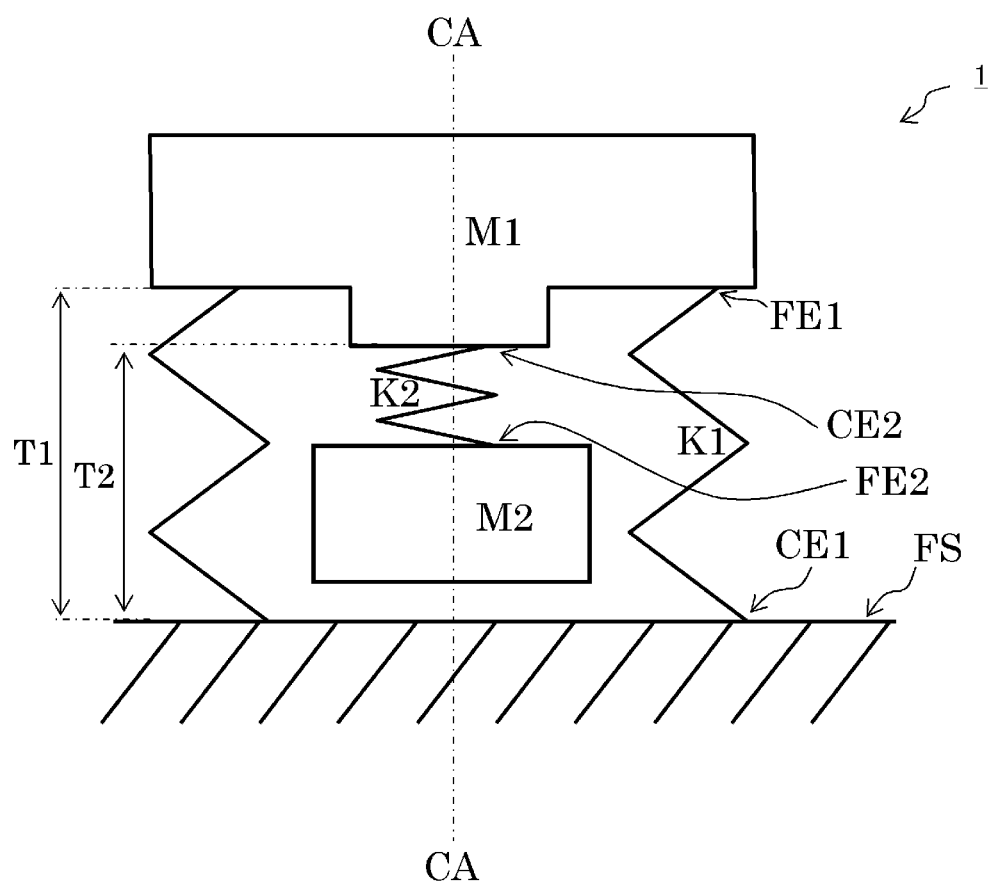
FIG. 1 is a schematic plan view for explaining the configuration of a piezoelectric power generation apparatus according to a first embodiment of the invention.

FIG. 1 is a schematic plan view illustrating the configuration of the piezoelectric power generation apparatus 1 according to the first embodiment of the invention. The piezoelectric power generation apparatus 1 in the first embodiment is configured by a first vibrating portion K1, a first weight portion M1, a second vibrating portion K2, and a second weight portion M2. The piezoelectric power generation apparatus 1 is arranged on a horizontal vibration surface FS.

The first vibrating portion K1 extends and contracts along an axis CA perpendicular to the vibration surface FS. The first vibrating portion K1 has a fixed end CE1 fixed to the vibration surface FS and a free end FE1 at the opposite side to the fixed end CE1. The first weight portion M1 is joined to the free end FE1 of the first vibrating portion K1. The first vibrating portion K1 and the first weight portion M1 configure a first resonator.

The first resonator alone resonates at a first resonant frequency on a relatively low frequency region that is substantially equal to vibration when people walk, vibrations of bicycles and cars, and the like, and vibrates longitudinally along the axis CA. The first resonator, therefore, resonates with longitudinal vibration at the first resonant frequency in external vibration that is applied to the vibration surface FS. Accordingly, the first resonator resonates, so that the amplitude of the first weight portion M1 becomes larger than that in the configuration in which external vibration is transmitted directly to the first weight portion M1.

The second vibrating portion K2 bends and vibrates along the axis CA perpendicular to the vibration surface FS. The second vibrating portion K2 has a fixed end CE2 jointed to the first weight portion M1 and a free end FE2 at the opposite side to the fixed end CE2. The second weight portion M2 is joined to the free end FE2 of the second vibrating portion K2. The second vibrating portion K2 and the second weight portion M2 configure a second resonator.

The second resonator alone resonates at a frequency same as the first resonant frequency or a second resonant frequency in the vicinity of the first resonant frequency, and vibrates longitudinally along the axis CA. Therefore, the second resonator is coupled to the first resonator, so that vibration energy is transmitted between the two resonators. This causes the second resonator to absorb the vibration energy of the first resonator and vibrate with a larger amplitude.

A surface of the first weight portion M1 to which the first vibrating portion K1 and the second vibrating portion K2 are joined is concavo-convex shape. A height position T2 of the fixed end CE2 of the second vibrating portion K2, which is joined to the first weight portion M1, and a height position T1 of the free end FE1 of the first vibrating portion K1, which is joined to the first weight portion M1, are different while setting the vibration surface FS as a reference. To be more specific, in a state where the first resonator and the second resonator are still, the position of the fixed end CE2 of the second vibrating portion K2 on the axis CA rather than the position of the free end FE1 of the first vibrating portion K1 on the axis CA is closer to the position of the fixed end CE1 of the first vibrating portion K1 on the axis CA while setting the vibration surface FS as a reference. Although details will be described later, the second vibrating portion K2 and the second weight portion M2 have a configuration in which the longitudinal vibration (main vibration) which is generated along the axis CA tends to be large and the lateral vibration (sub vibration) which is generated along the direction orthogonal to the axis CA tends to be small. Therefore, the piezoelectric power generation apparatus 1 can achieve high power generation efficiency by providing a piezoelectric element for generating electric power with the main vibration on the second vibrating portion K2.

Figure 2:
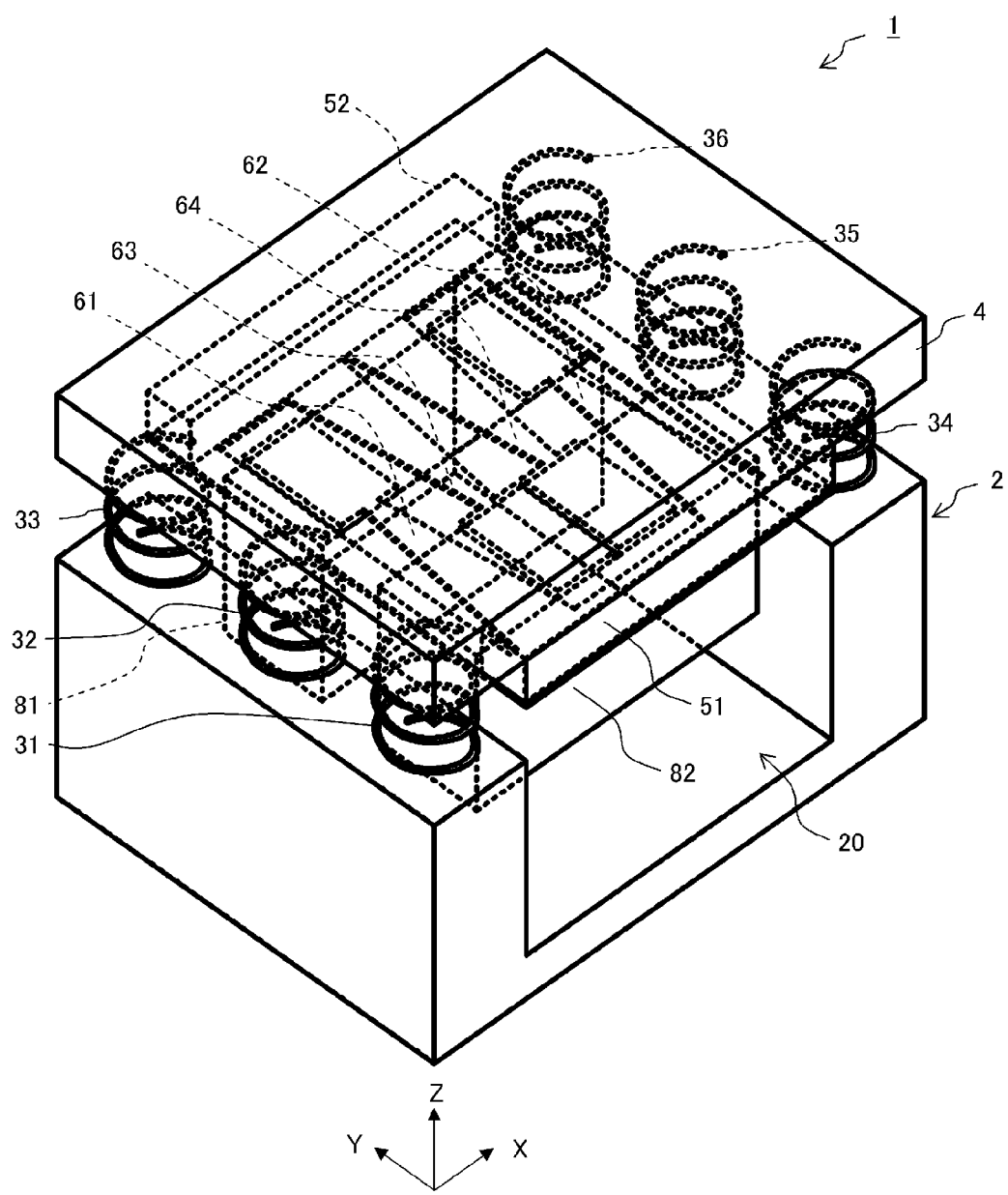
FIG. 2 is a perspective view for explaining the detail configuration of the piezoelectric power generation apparatus according to the first embodiment of the invention.
Figure 3:
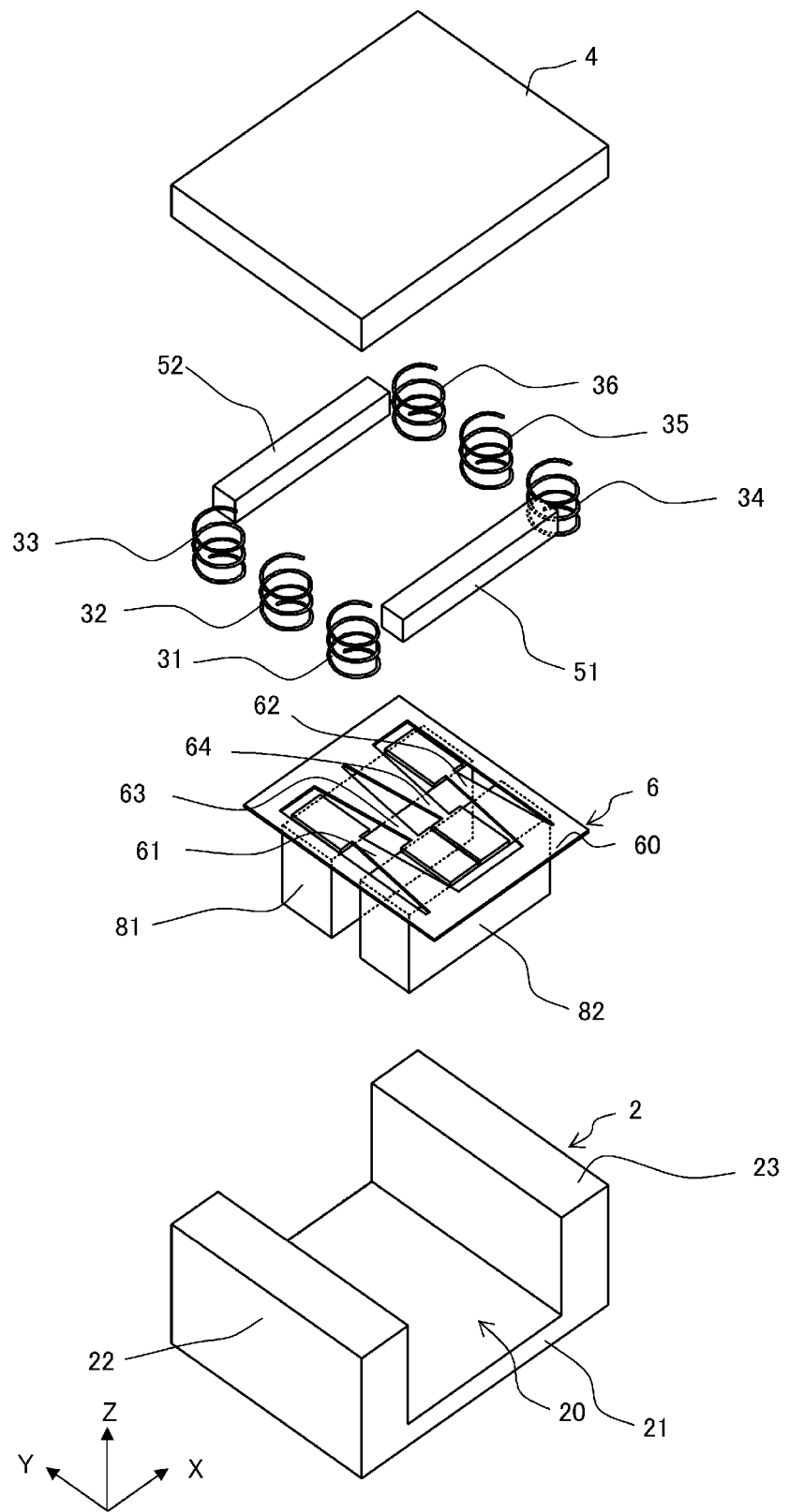
FIG. 3 is an exploded perspective view illustrating a state where the piezoelectric power generation apparatus according to the first embodiment of the invention is taken apart.
Figure 5A:
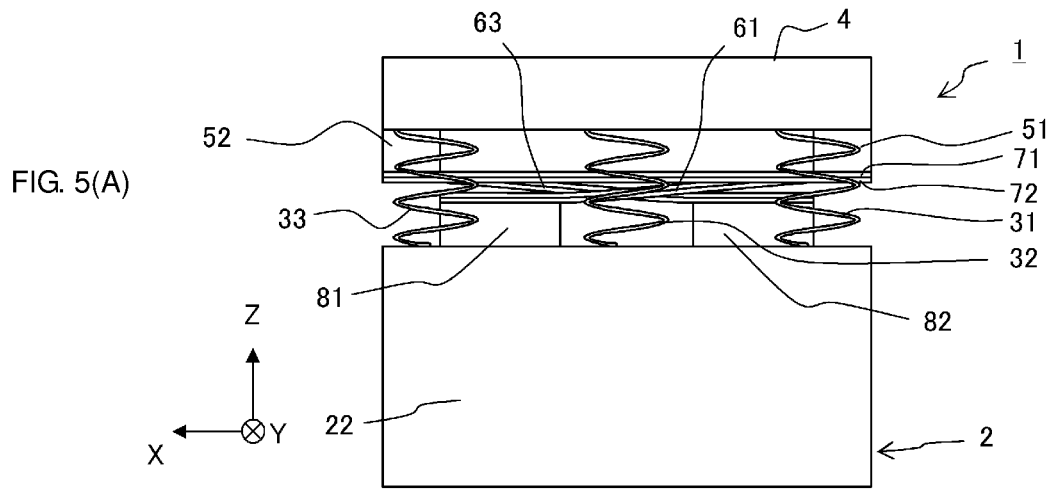
FIGS. 5(A) to 5(C) show a side view and cross-sectional views illustrating the piezoelectric power generation apparatus according to the first embodiment of the invention.
Figure 5B:
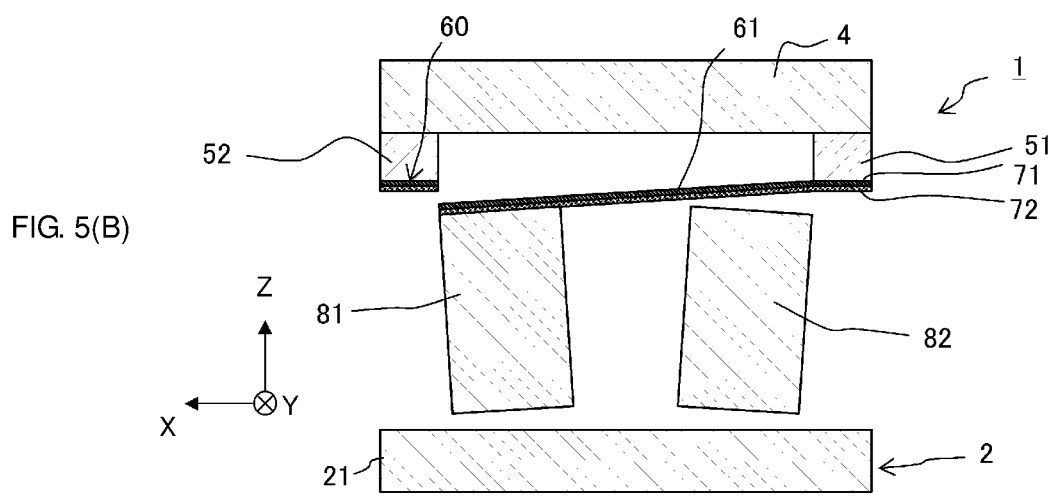
Figure 5C:
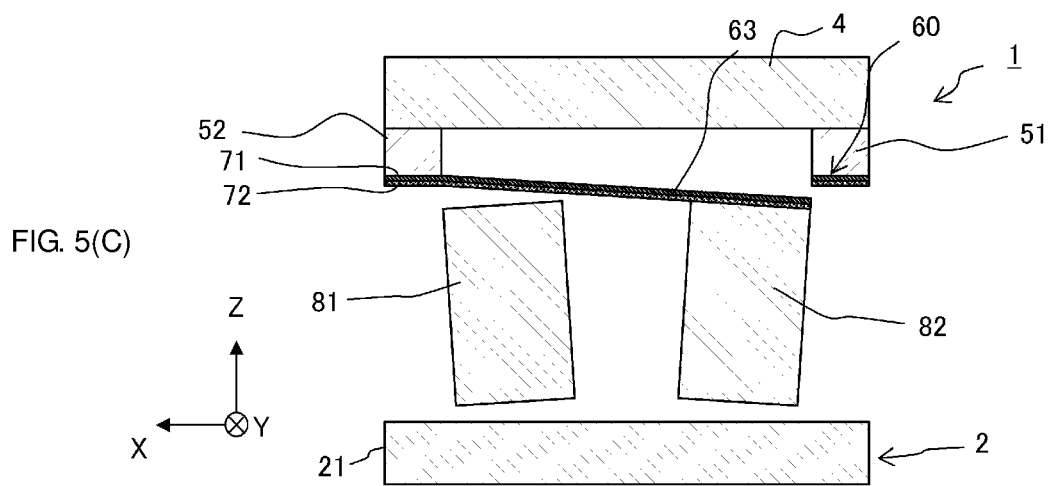

Hereinafter, the piezoelectric power generation apparatus 1 according to the first embodiment is described by using a piezoelectric power generation apparatus that is arranged on the horizontal vibration surface FS as an example. In the drawings to be referred in the following description, a Cartesian coordinate system formed by an X-axis, a Y-axis orthogonal to the X-axis, and a Z-axis orthogonal to the X-axis and the Y-axis is noted. A plane parallel with the horizontal vibration surface FS is assumed to be an X-Y plane and an axis orthogonal to the horizontal vibration surface FS is assumed to be the Z-axis. FIG. 2 is a perspective view illustrating the piezoelectric power generation apparatus 1 according to the first embodiment of the invention. FIG. 3 is an exploded perspective view illustrating a state where the piezoelectric power generation apparatus 1 according to the first embodiment of the invention is taken apart. FIG. 4(A) is an X-Z plane side view illustrating the piezoelectric power generation apparatus 1 according to the first embodiment of the invention when seen from the Y-axis positive direction. FIG. 4(B) is an X-Z plane side cross-sectional view illustrating the piezoelectric power generation apparatus 1 according to the first embodiment of the invention when seen from the Y-axis positive direction and illustrates an X-Z plane cross section at a position dividing a weight portion 82, which will be described later. FIG. 4(C) is an X-Z plane side cross-sectional view illustrating the piezoelectric power generation apparatus 1 according to the first embodiment of the invention when seen from the Y-axis positive direction and illustrates an X-Z plane cross section at a position dividing a weight portion 81, which will be described later. FIG. 5(A) is a Y-Z plane side view illustrating the piezoelectric power generation apparatus 1 according to the first embodiment of the invention when seen toward the X-axis positive direction. FIG. 5(B) is a Y-Z plane side cross-sectional view illustrating the piezoelectric power generation apparatus 1 according to the first embodiment of the invention when seen from the X-axis positive direction and illustrates a Y-Z plane cross section at a position dividing a power generation element 61, which will be described later. FIG. 5(C) is a Y-Z plane side cross-sectional view illustrating the piezoelectric power generation apparatus 1 according to the first embodiment of the invention when seen from the X-axis positive direction and illustrates a Y-Z plane cross section at a position dividing a power generation element 63, which will be described later.

The piezoelectric power generation apparatus 1 includes a pedestal portion 2, coil springs 31, 32, 33, 34, 35, and 36, a weight plate 4, fixing portions 51 and 52, power generation elements 61, 62, 63, and 64, weight portions 81 and 82. The piezoelectric power generation apparatus 1 is configured to have a schematic hexahedron shape overall and the dimension thereof in the X-axis direction is approximately 30 mm and the dimension thereof in the Y-axis direction is approximately 30 mm.

The pedestal portion 2 has a shape that a groove 20 extending along the Y-axis direction is formed on the upper surface of the hexahedron shape formed by surfaces perpendicular to the X-axis, the Y-axis, and the Z-axis, respectively. As illustrated in FIG. 3, the pedestal portion 2 includes a bottom plate portion 21, a side wall portion 22, and a side wall portion 23. The bottom plate portion 21 is provided such that the planar shape thereof is a rectangular flat plate shape and the lower surface (surface at the Z-axis negative direction side) thereof makes contact with the horizontal vibration surface FS. That is to say, the pedestal portion 2 is provided such that the lower surface thereof makes contact with the horizontal vibration surface FS. Each of the side wall portions 22 and 23 has a rectangular parallelepiped shape and is provided so as to be orthogonal to the upper surface (surface at the Z-axis positive direction side) of the bottom plate portion 21. The side wall portions 22 and 23 are provided along two sides of the bottom plate portion 21, which are parallel with the Y-axis. A portion surrounded by the side wall portions 22 and 23 and the bottom plate portion 21 configures an inner portion of the groove 20. The pedestal portion 2 may be a part of a case of an electronic apparatus on which the piezoelectric power generation apparatus 1 is mounted and the shape of the pedestal portion 2 is arbitrary as long as it is a member receiving external vibration.

The coil springs 31, 32, and 33 are arranged between the upper surface (surface at the Z-axis positive direction side) of the side wall portion 22 and the lower surface (surface at the Z-axis negative direction side) of the weight plate 4. The coil springs 31, 32, and 33 are aligned in order along the Y-axis direction. The extension and contraction direction of the coil springs 31, 32, and 33 is the Z-axis direction. End portions of the coil springs 31, 32, and 33 at one side in the Z-axis direction are joined to the upper surface of the side wall portion 22 and correspond to the fixed ends CE1. End portions of the coil springs 31, 32, and 33 at the other side in the Z-axis direction are joined to the lower surface of the weight plate 4 and correspond to the free ends FE1.

The coil springs 34, 35, and 36 are arranged between the upper surface (surface at the Z-axis positive direction side) of the side wall portion 23 and the lower surface (surface at the Z-axis negative direction side) of the weight plate 4. The coil springs 34, 35, and 36 are aligned in order along the Y-axis direction. The extension and contraction direction of the coil springs 34, 35, and 36 is the Z-axis direction. End portions of the coil springs 34, 35, and 36 at one side in the Z-axis direction are joined to the upper surface of the side wall portion 23 and correspond to the fixed ends CE1. End portions of the coil springs 34, 35, and 36 at the other side in the Z-axis direction are joined to the lower surface of the weight plate 4 and correspond to the free ends FE1.

The coil springs 31 to 36 configure the above-mentioned first vibrating portion K1. The coil springs 31 to 36 are arranged between the pedestal portion 2 and the weight plate 4. Each of the coil springs 31 to 36 has a spring constant of 0.075 N/mm, for example. Although the six coil springs 31 to 36 are used in the embodiment, the total number of coil springs is not limited to six. Further, the first vibrating portion K1 may be configured by another elastic member such as a plate spring or a rubber member instead of the coil springs 31 to 36.

The thickness direction of the weight plate 4 is the Z-axis direction and the weight plate 4 is a rectangular flat plate when seen from the above. The outer shape of the weight plate 4 is identical to the outer shape of the pedestal portion 2 when seen from the above. The weight plate 4 is joined to the pedestal portion 2 through the coil springs 31 to 36. Therefore, the weight plate 4 is arranged above the pedestal portion 2 and is elastically supported on the pedestal portion 2 with the coil springs 31 to 36. The weight plate 4 is made of a metal having high rigidity and high density, or the like, and configures the above-mentioned first weight portion M1 together with the fixing portions 51 and 52.

The fixing portions 51 and 52 configure the first weight portion M1 together with the weight plate 4 and are provided on the lower surface of the weight plate 4 so as to make the lower surface of the first weight portion M1 in concavo-convex shape. The respective fixing portions 51 and 52 have rectangular parallelepiped shapes that the X-axis direction is set to the lengthwise direction thereof and are provided along two sides of the lower surface of the weight plate 4, which are parallel with the X-axis. The fixing portions 51 and 52 may be formed by members different from that of the weight plate 4 to be joined to the lower surface of the weight plate 4 or may be configured as members integrated with the weight plate 4.

The power generation elements 61 to 64 and an outer frame portion 60 configure a power generation portion 6. The power generation elements 61 to 64 are aligned in order along the X-axis direction. The power generation elements 61 to 64 are bonded to the outer frame portion 60 having an opening. The power generation elements 61 to 64 configure the above-mentioned second vibrating portion K2. As illustrated in FIGS. 4(A) to 4(C) and FIGS. 5(A) to 5(C), each of the power generation elements 61 to 64 includes a vibrating plate 71 and a piezoelectric element 72 provided on the lower surface (surface at the Z-axis negative direction side) of the vibrating plate 71 and has a unimorph structure. Alternatively, each of the power generation elements 61 to 64 may have a unimorph structure in which the piezoelectric element 72 is provided on the upper surface (surface at the Z-axis positive direction side) of the vibrating plate 71. Further, each of the power generation elements 61 to 64 may have a bimorph structure in which the piezoelectric elements 72 are provided on the upper surface and the lower surface of the vibrating plate 71.

The vibrating plate 71 has a substantially isosceles triangular portion the width of which is narrower from the fixed end to the free end gradually and a rectangular portion when seen from the above. The piezoelectric element 72 is provided on the substantially isosceles triangular portion of the vibrating plate 71. The portion of the vibrating plate 71 on which the piezoelectric element is provided may have another shape such as an oblong shape and a substantially meander shape instead of the substantially isosceles triangular shape. The vibrating plate 71 is made of a metal and is provided integrally with the outer frame portion 60. The vibrating plate 71 may be made of silicon, glass epoxy, or the like. The thickness of the vibrating plate 71 is 75 μm.

The piezoelectric element 72 includes a flat plate-like piezoelectric body and electrodes (not illustrated) provided on the surfaces of the piezoelectric body, which oppose each other. In the embodiment, the piezoelectric body configuring the piezoelectric element 72 is made of PZT-based piezoelectric ceramics and the electrodes configuring the piezoelectric element 72 are made of NiCr alloy, NiCu alloy, gold, silver, or the like. In each of the power generation elements 61 to 64, the piezoelectric element 72 is provided on the lower surface of the vibrating plate 71, so that compression stress always acts on the piezoelectric element 72 due to the influence of gravity force acting on the weight portions 81 and 82. The piezoelectric ceramics has excellent mechanical strength against the compression stress rather than the tensile stress, in general. Therefore, the piezoelectric element 72 is provided in the direction that the compression stress acts, so that durability of the piezoelectric element 72 made of the piezoelectric ceramics can be enhanced. The piezoelectric body configuring the piezoelectric element 72 may be made of a material capable of converting mechanical energy into electric energy, for example, an organic piezoelectric material or a dielectric polymer instead of the piezoelectric ceramics. The thickness of the piezoelectric element 72 is 75 μm.

The power generation elements 61 and 62 are provided so as to extend along the Y-axis positive direction. As illustrated in FIG. 3, end portions of the power generation elements 61 and 62 at the Y-axis negative direction side are bonded to the outer frame portion 60 and portions of the outer frame portion 60, which are bonded to the power generation elements 61 and 62, are bonded to the lower surface (surface at the Z-axis negative direction side) of the fixing portion 51. Therefore, the end portions of the power generation elements 61 and 62 at the Y-axis negative direction side are bonded to the lower surface of the fixing portion 51 through the outer frame portion 60. The end portions of the power generation elements 61 and 62 at the Y-axis negative direction side correspond to fixed ends and end portions of the power generation elements 61 and 62 at the Y-axis positive direction side correspond to free ends. With this, the power generation elements 61 and 62 are configured so as to bend and vibrate along the Z-axis direction with a cantilever form.

The power generation elements 63 and 64 are provided so as to extend along the Y-axis negative direction. As illustrated in FIG. 3, end portions of the power generation elements 63 and 64 at the Y-axis positive direction side are bonded to the outer frame portion 60 and portions of the outer frame portion 60, which are jointed to the power generation elements 63 and 64, are bonded to the lower surface (surface at the Z-axis negative direction side) of the fixing portion 52. Therefore, the end portions of the power generation elements 63 and 64 at the Y-axis positive direction side are bonded to the lower surface of the fixing portion 52 through the outer frame portion 60. The end portions of the power generation elements 63 and 64 at the Y-axis positive direction side correspond to fixed ends and end portions of the power generation elements 63 and 64 at the Y-axis negative direction side correspond to free ends. With this, the power generation elements 63 and 64 are configured so as to bend and vibrate along the Z-axis direction with a cantilever form.

Each of the weight portions 81 and 82 configures the above-mentioned second weight portion M2. The weight portions 81 and 82 are arranged above the pedestal portion 2 and are elastically supported by the power generation elements 61 to 64. The weight portions 81 and 82 have rectangular parallelepiped shapes. The weight portions 81 and 82 are made of metal having high rigidity and high density, or the like, in the same manner as the weight plate 4, and the mass of each of the weight portions 81 and 82 is 60.0 g.

The weight portion 81 is bonded to the lower surfaces (surfaces at the Z-axis negative direction side) of the end portions of the power generation elements 61 and 62 at the Y-axis positive direction side. To be specific, the weight portion 81 is bonded to the lower surfaces (surfaces at the Z-axis negative direction side) of the rectangular portions of the vibrating plates 71 configuring the power generation elements 61 and 62. The weight portion 82 is bonded to the lower surface (surfaces at the Z-axis negative direction side) of the end portions of the power generation elements 63 and 64 at the Y-axis negative direction side. To be specific, the weight portion 82 is bonded to the lower surfaces (surfaces at the Z-axis negative direction side) of the rectangular portions of the vibrating plates 71 configuring the power generation elements 63 and 64. As illustrated in FIGS. 4(A) to 4(C) and FIGS. 5(A) to 5(C), the weight portions 81 and 82 are bonded to the vicinities of the free ends of the power generation elements 61 to 64 and gravity force acts on the weight portions 81 and 82. Therefore, when the power generation elements 61 to 64 do not vibrate, the free ends of the power generation element 61 to 64 will bend in the Z-axis negative direction.

A basic resonant frequency (first resonant frequency) of the first resonator configured by the first vibrating portion K1 and the first weight portion M1, in other words, the first resonator configured by the coil springs 31 to 36, the weight plate 4, and the fixing portions 51 and 52 is preferably the same or close to a basic resonant frequency (second resonant frequency) of the second resonator configured by the second vibrating portion K2 and the second weight portion M2, in other words, the second resonator configured by the power generation elements 61 to 64 and the weight portions 81 and 82. In the piezoelectric power generation apparatus 1 having this configuration, when vibration in the direction perpendicular to the vibration surface FS is generated with force such as external vibration, the first resonator and the second resonator are coupled at the same frequency or close frequencies and vibration energy is transmitted between the first resonator and the second resonator. This causes the second resonator to absorb the vibration energy from the first resonator and vibrate with a larger amplitude. Further, the power generation elements 61 to 64 configure the second resonator. Therefore, larger electric power can be obtained than that in the case of the power generation element alone.

The basic resonant frequency of the first resonator and the basic resonant frequency of the second resonator are set to any frequencies in a range of several Hz to 100 Hz appropriately in consideration of force such as external vibration. When the piezoelectric power generation apparatus 1 is mounted on an electronic apparatus that is used by a user or an electronic apparatus that is mounted on bicycle, cars, or the like, the basic resonant frequency of the first resonator and the basic resonant frequency of the second resonator are set to approximately 15 Hz, for example.

In the piezoelectric power generation apparatus 1, the second resonator configured by the power generation elements 61 and 62 and the weight portion 81 and the second resonator configured by the power generation elements 63 and 64 and the weight portion 82 are arranged such that the directions thereof along the Y-axis are alternately set. In other words, a part of the weight portion 81 is located at the fixed end side and the Z-axis negative direction side of the power generation elements 63 and 64 and a part of the weight portion 82 is located at the fixed end side and the Z-axis negative direction side of the power generation elements 61 and 62. Therefore, the two second resonators are arranged in a narrow space. The basic resonant frequencies of these second resonators are made substantially equal to each other and electric powers that are output from the respective power generation elements are made to match through a matching circuit. This enables the piezoelectric power generation apparatus 1 to achieve high power generation efficiency.

As illustrated in FIG. 4(A), in the piezoelectric power generation apparatus 1, the fixing portions 51 and 52 are provided on the lower surface of the weight plate 4 and the fixed ends (CE2) of the power generation elements 61 to 64 are bonded to the lower surfaces of the fixing portions 51 and 52 through the outer frame portion 60. On the other hand, the free ends (FE1) of the coil springs 31 to 36 are joined to the lower surface of the weight plate 4. Accordingly, the height position (position in the Z-axis direction) T2 of the fixed ends (CE2) of the power generation elements 61 to 64 and the height position (position in the Z-axis direction) T1 of the free ends (FE1) of the coil springs 31 to 36 are different while setting the vibration surface FS with which the lower surface of the pedestal portion 2 makes contact as a reference. To be more specific, in a state where the first resonator and the second resonator are still, the positions of the fixed ends (CE2) of the power generation elements 61 to 64 in the Z-axis direction rather than the positions of the free ends (FE1) of the coil springs 31 to 36 in the Z-axis direction are closer to the positions of the fixed ends (CE1) of the coil springs 31 to 36 while setting the vibration surface FS with which the lower surface of the pedestal portion 2 makes contact as a reference. The height position T1 of the free ends (FE1) of the coil springs 31 to 36 and the height position T2 of the fixed ends (CE2) of the power generation elements 61 to 64 influence a magnitude of an amplitude of longitudinal vibration (main vibration) which is generated on the power generation elements 61 to 64 along the Z-axis and a magnitude of an amplitude of sub vibration (lateral vibration) which is generated thereon along the X-axis direction and the Y-axis direction. Therefore, the fixed ends (CE2) of the power generation elements 61 to 64 are located at the Z-axis negative direction side relative to the free ends (FE1) of the coil springs 31 to 36, thereby largely suppressing the sub vibration (lateral vibration) which is generated on the power generation elements 61 to 64 along the X-axis direction and the Y-axis direction.

Then, described is simulation performed for checking the influence that is given onto the longitudinal vibration (main vibration) which is generated on the power generation elements 61 to 64 along the Z-axis and the sub vibration (lateral vibration) which is generated thereon along the X-axis direction and the Y-axis direction by the height position of the free ends (FE1) of the coil springs 31 to 36 and the height position (position in the Z-axis direction) of the fixed ends (CE2) of the power generation elements 61 to 64. In the simulation, a relation between the height position of the fixed ends (CE2) of the power generation elements 61 to 64 and an electromechanical coupling coefficient of the main vibration is calculated while employing the configuration that is the same as the above-mentioned configuration. In addition, a relation between the height position of the fixed ends (CE2) of the power generation elements 61 to 64 and an electromechanical coupling coefficient of the sub vibration is calculated while employing a comparison configuration in which vibration energy of not the main vibration but the sub vibration is converted into electric energy.

In the state where the first resonator and the second resonator are still, when the difference (T2−T1) between the height position T1 of the free ends (FE1) of the coil springs 31 to 36 and the height position T2 of the fixed ends (CE2) of the power generation elements 61 to 64 while setting the height position (position in the Z-axis direction) of the fixed ends (CE1) of the coil springs 31 to 36 as a reference is negative, the fixed ends (CE2) of the power generation elements 61 to 64 are located at the Z-axis negative direction side relative to the free ends (FE1) of the coil springs 31 to 36. That is to say, as described in the above-mentioned embodiment, the fixed ends (CE2) of the power generation elements 61 to 64 are bonded to the lower surfaces of the fixing portions 51 and 52 projecting from the lower surface of the weight plate 4. On the other hand, when the difference (T2−T1) is positive, the fixed ends (CE2) of the power generation elements 61 to 64 are located at the Z-axis positive direction side relative to the free ends (FE1) of the coil springs 31 to 36. In this case, the height position T2 of the fixed ends (CE2) of the power generation elements 61 to 64 is required to be raised or the height position T1 of the free ends (FE1) of the coil springs 31 to 36 is required to be lowered by providing recess portions on the lower surface of the weight plate 4 or interposing spacers between the weight plate 4 and the coil springs 31 to 36.

Figure 6A:
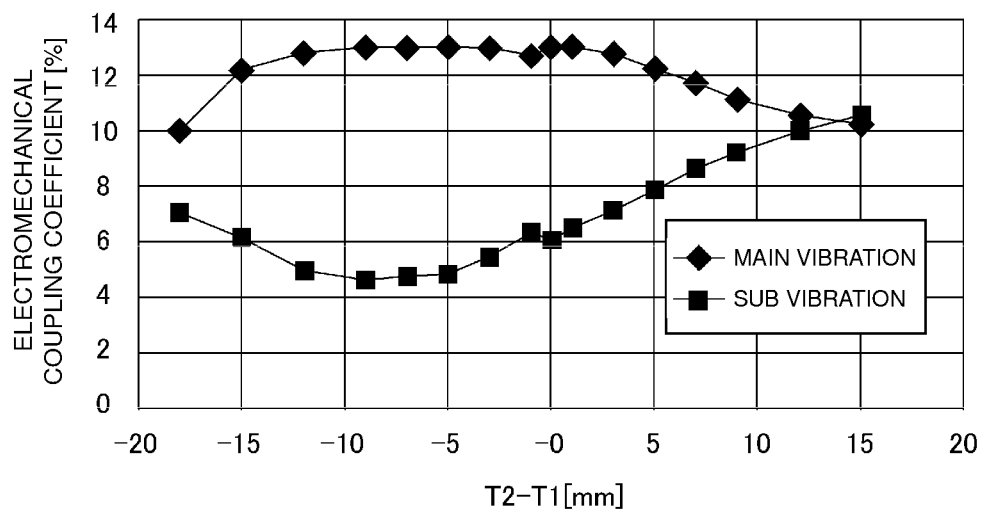
FIGS. 6(A) and 6(B) show graphs for explaining relations between height positions of an end portion of a coil spring and an end portion of a power generation element and electromechanical coupling coefficients of main vibration and sub vibration in the piezoelectric power generation apparatus according to the first embodiment of the invention.

FIG. 6(A) is a graph illustrating relations between the difference (T2−T1) and the electromechanical coupling coefficients of the main vibration and the sub vibration. The difference (T2−T1) is changed in a range of −18 mm to +15 mm. As illustrated in FIG. 6(A), the electromechanical coupling coefficient of the main vibration is large when the difference (T2−T1) is in a range of −15 mm to +5 mm. On the other hand, when the difference (T2−T1) is in a range of smaller than −15 mm, that is, when the height dimension (dimension in the Z-axis direction) of the fixing portions 51 and 52 is in a range of larger than 15 mm, the electromechanical coupling coefficient of the main vibration is small. Further, when the difference (T2−T1) is in a range of larger than +5 mm, that is, when recess portions to which the power generation elements 61 to 64 are bonded are provided on a bottom portion of the weight plate 4 instead of the fixing portions 51 and 52 and the depth of the recess portions is in a range of larger than +5 mm, the electromechanical coupling coefficient of the main vibration is also small.

As illustrated in FIG. 6(A), when the difference (T2−T1) is in a range of −10 mm to −5 mm, the electromechanical coupling coefficient of the sub vibration is small. On the other hand, when the difference (T2−T1) is in a range of smaller than −10 mm, that is, when the height (dimension in the Z-axis direction) of the fixing portions 51 and 52 is in a range of larger than 10 mm, the electromechanical coupling coefficient of the sub vibration is large. Further, when the difference (T2−T1) is in a range of larger than −5 mm, that is, when the height dimension (dimension in the Z-axis direction) of the fixing portions 51 and 52 is smaller than 5 mm or when the recess portions to which the power generation elements 61 to 64 are bonded are provided on the bottom portion of the weight plate 4 instead of the fixing portions 51 and 52, the electromechanical coupling coefficient of the sub vibration is also large.

From the above-mentioned results, it is found that the height position T2 of the fixed ends (CE2) of the power generation elements 61 to 64 influences the magnitude of the amplitude of the longitudinal vibration (main vibration) which is generated on the power generation elements 61 to 64 along the Z-axis and the magnitude of the amplitude of the sub vibration (lateral vibration) which is generated thereon along the X-axis direction and the Y-axis direction. In other words, it is found that the height position T2 of the fixed ends (CE2) of the power generation elements 61 to 64 influences the magnitude of the amplitude of the longitudinal vibration (main vibration) which is generated on the power generation elements 61 to 64 along the Z-axis and the magnitude of the amplitude of the sub vibration (lateral vibration) which is generated thereon along the X-axis direction and the Y-axis direction. In addition, it is found that the electromechanical coupling coefficient of the main vibration and the electromechanical coupling coefficient of the sub vibration are changed inversely with the change in the height position T2 of the fixed ends (CE2) of the power generation elements 61 to 64. Further, increase in the electromechanical coupling coefficient of the main vibration indicates increase in power generation efficiency of the piezoelectric power generation apparatus 1. Therefore, in the piezoelectric power generation apparatus 1 in the first embodiment, high power generation efficiency can be achieved by setting the height position T1 of the free ends (FE1) of the coil springs 31 to 36 and the height position T2 of the fixed ends (CE2) of the power generation elements 61 to 64 such that the difference (T2−T1) is in the range of −15 mm to +5 mm. Moreover, the piezoelectric power generation apparatus 1 in the first embodiment can reduce unnecessary sub vibration and improve reliability by decreasing the electromechanical coupling coefficient of the sub vibration.

Figure 6B:
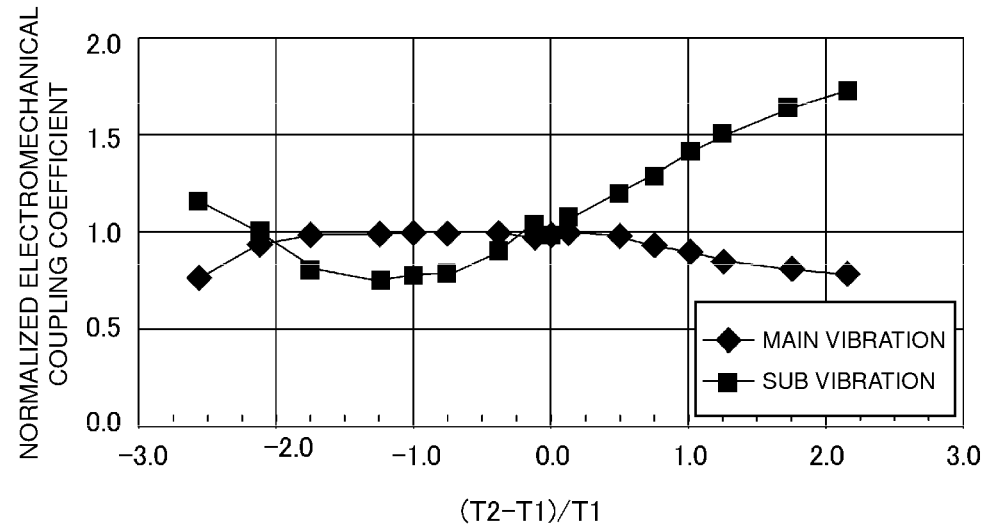

FIG. 6(B) is a graph illustrating relations between a normalized difference (T2−T1)/T1 obtained by normalizing the difference (T2−T1) by T1 and normalized electromechanical coupling coefficients obtained by normalizing the electromechanical coupling coefficients of the main vibration and the sub vibration based on the time when the normalized difference (T2−T1)/T1 is 0. As illustrated in FIG. 6(B), when the normalized difference (T2−T1)/T1 satisfies a relation of −2.1<(T2−T1)/T1<−0.1, the normalized electromechanical coupling coefficient of the main vibration is larger than the normalized electromechanical coupling coefficient of the sub vibration. Accordingly, in the piezoelectric power generation apparatus 1 in the first embodiment, the height position T1 of the free ends (FE1) of the coil springs 31 to 36 and the height position T2 of the fixed ends (CE2) of the power generation elements 61 to 64 are set such that the normalized difference (T2−T1)/T1 satisfies the relation of −2.1<(T2−T1)/T1<−0.1. This setting can cause to achieve high power generation efficiency, reduce unnecessary sub vibration, and improve reliability.

Hereinbefore, in the embodiment as described above, the height position T1 of the free ends (FE1) of the coil springs 31 to 36 and the height position T2 of the fixed ends (CE2) of the power generation elements 61 to 64 are different. With this, the longitudinal vibration (main vibration) which is generated on the power generation elements 61 to 64 along the Z-axis and the sub vibration (lateral vibration) which is generated thereon along the X-axis direction and the Y-axis direction are adjusted. This can cause to achieve high power generation efficiency, reduce unnecessary sub vibration, and improve reliability.

Specific configurations of the respective components can be changed in design appropriately. Actions and effects described in the embodiments are merely examples as the most preferable actions and effects derived from the invention, and the actions and effects according to the invention are not limited to those as described in the above-mentioned embodiment.

Figure 7:
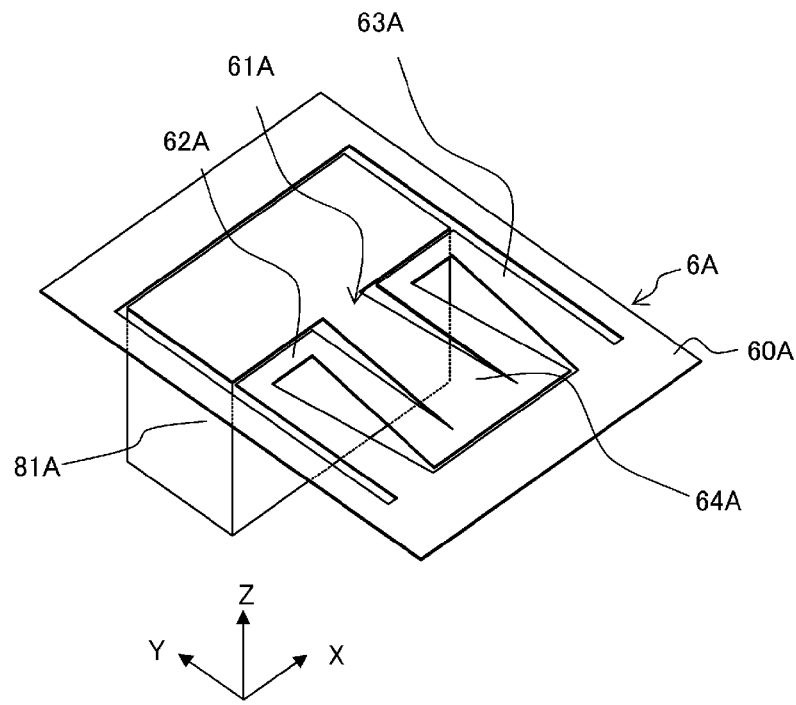
FIG. 7 is a partial perspective view for explaining a part of the configuration of a piezoelectric power generation apparatus according to a second embodiment of the invention.

Next, a piezoelectric power generation apparatus according to a second embodiment of the invention is described with reference to FIG. 7. FIG. 7 is a partial perspective view illustrating a power generation portion 6A and a weight portion 81A configuring the piezoelectric power generation apparatus according to the second embodiment of the invention. Although not illustrated in FIG. 7, configurations other than the power generation portion 6A and the weight portion 81A in the piezoelectric power generation apparatus in the embodiment are the same as those in the piezoelectric power generation apparatus 1 in the first embodiment.

The power generation portion 6A is configured by an outer frame portion 60A and a power generation element 61A. The outer frame portion 60A has a rectangular opening when seen from the above. The power generation element 61A is bonded to the outer frame portion 60A in the opening. The power generation element 61A configures the second vibrating portion K2 and includes a vibrating plate and a piezoelectric element (not illustrated) provided on the lower surface (surface at the Z-axis negative direction side) of the vibrating plate. The weight portion 81A configures the second weight portion M2.

To be more specific, the power generation element 61A includes fixed end-side beam portions 62A and 63A and a free end-side beam portion 64A. The free end-side beam portion 64A is provided so as to extend in the Y-axis negative direction from an end portion as a free end that is bonded to the upper surface (surface at the Z-axis positive direction side) of the weight portion 81A. The fixed end-side beam portion 62A is arranged at the X-axis negative direction side relative to the free end-side beam portion 64A. The fixed end-side beam portion 62A is provided such that one end thereof is connected to an end portion of the free end-side beam portion 64A at the Y-axis negative direction side, is drawn to the Y-axis positive direction side therefrom, is folded to the Y-axis negative direction side, and extends to a portion of the outer frame portion 60A, which is bonded to the lower surface (surface at the Z-axis negative direction side) of the fixing portion (not illustrated). The fixed end-side beam portion 63A is arranged at the X-axis positive direction side relative to the free end-side beam portion 64A. The fixed end-side beam portion 63A is provided such that one end thereof is connected to an end portion of the free end-side beam portion 64A at the Y-axis negative direction side, is drawn to the Y-axis positive direction side therefrom, is folded to the Y-axis negative direction side, and extends to a portion of the outer frame portion 60A, which is bonded to the lower surface (surface at the Z-axis negative direction side) of the fixing portion (not illustrated).

The power generation element 61A is configured by the fixed end-side beam portions 62A and 63A and the free end-side beam portion 64A and is formed into a substantially meander line shape. Therefore, the substantial dimension of the power generation element 61A in the lengthwise direction is longer than that of the power generation elements 61 to 64 in the first embodiment. Accordingly, spring elasticity and resonant frequency of the power generation element 61A can be set in a wider range.

Figure 8:
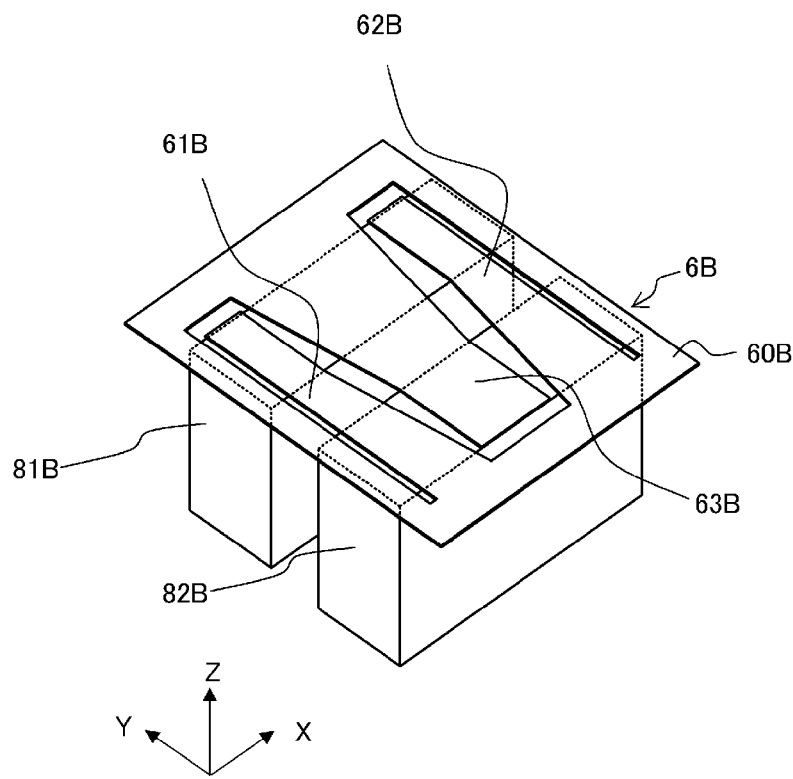
FIG. 8 is a partial perspective view for explaining a part of the configuration of a piezoelectric power generation apparatus according to a third embodiment of the invention.

Next, a piezoelectric power generation apparatus according to a third embodiment of the invention is described with reference to FIG. 8. FIG. 8 is a partial perspective view illustrating a power generation portion 6B and weight portions 81B and 82B configuring the piezoelectric power generation apparatus according to the third embodiment of the invention. Although not illustrated in FIG. 8, configurations other than the power generation portion 6B and the weight portions 81B and 82B in the piezoelectric power generation apparatus in the embodiment are the same as those in the piezoelectric power generation apparatus 1 in the first embodiment.

The power generation portion 6B is configured by an outer frame portion 60B and power generation elements 61B, 62B, and 63B. The outer frame portion 60B has a rectangular opening when seen from the above. The power generation elements 61B, 62B, and 63B are bonded to the outer frame portion 60A in the opening. The power generation elements 61B to 63B configure the second vibrating portion K2 and includes a vibrating plate and a piezoelectric element (not illustrated) provided on the lower surface (surface at the Z-axis negative direction side) of the vibrating plate. Each of the weight portions 81B and 82B configures the second weight portion M2.

To be more specific, each of the power generation element 61B and the power generation element 62B is provided so as to extend along the Y-axis positive direction. End portions of the power generation elements 61B and 62B at the Y-axis negative direction side are bonded to the outer frame portion 60B and portions of the outer frame portion 60B, which are bonded to the power generation elements 61B and 62B, are bonded to the lower surface (surface at the Z-axis negative direction side) of the fixing portion (not illustrated). End portions of the power generation elements 61B and 62B at the Y-axis positive direction side are bonded to the upper surface (surface at the Z-axis positive direction side) of the weight portion 81B. The power generation element 63B is provided so as to extend along the Y-axis negative direction. An end portion of the power generation element 63B at the Y-axis positive direction side is bonded to the outer frame portion 60B and a portion of the outer frame portion 60B, which is bonded to the power generation element 63B, is bonded to the lower surface (surface at the Z-axis negative direction side) of the fixing portion (not illustrated). An end portion of the power generation element 63B at the Y-axis negative direction side is bonded to the upper surface (surface at the Z-axis positive direction side) of the weight portion 82B.

The weight portion 81B is elastically supported by the power generation elements 61B and 62B and the weight portion 82B is elastically supported by the power generation element 63B. The spring elasticity and the resonant frequency of the power generation elements 61B and 62B and the spring elasticity and the resonant frequency of the power generation element 63B can be made substantially equal to each other by increasing the width dimension (dimension in the X-axis direction) of the power generation element 63B.

Figure 9:
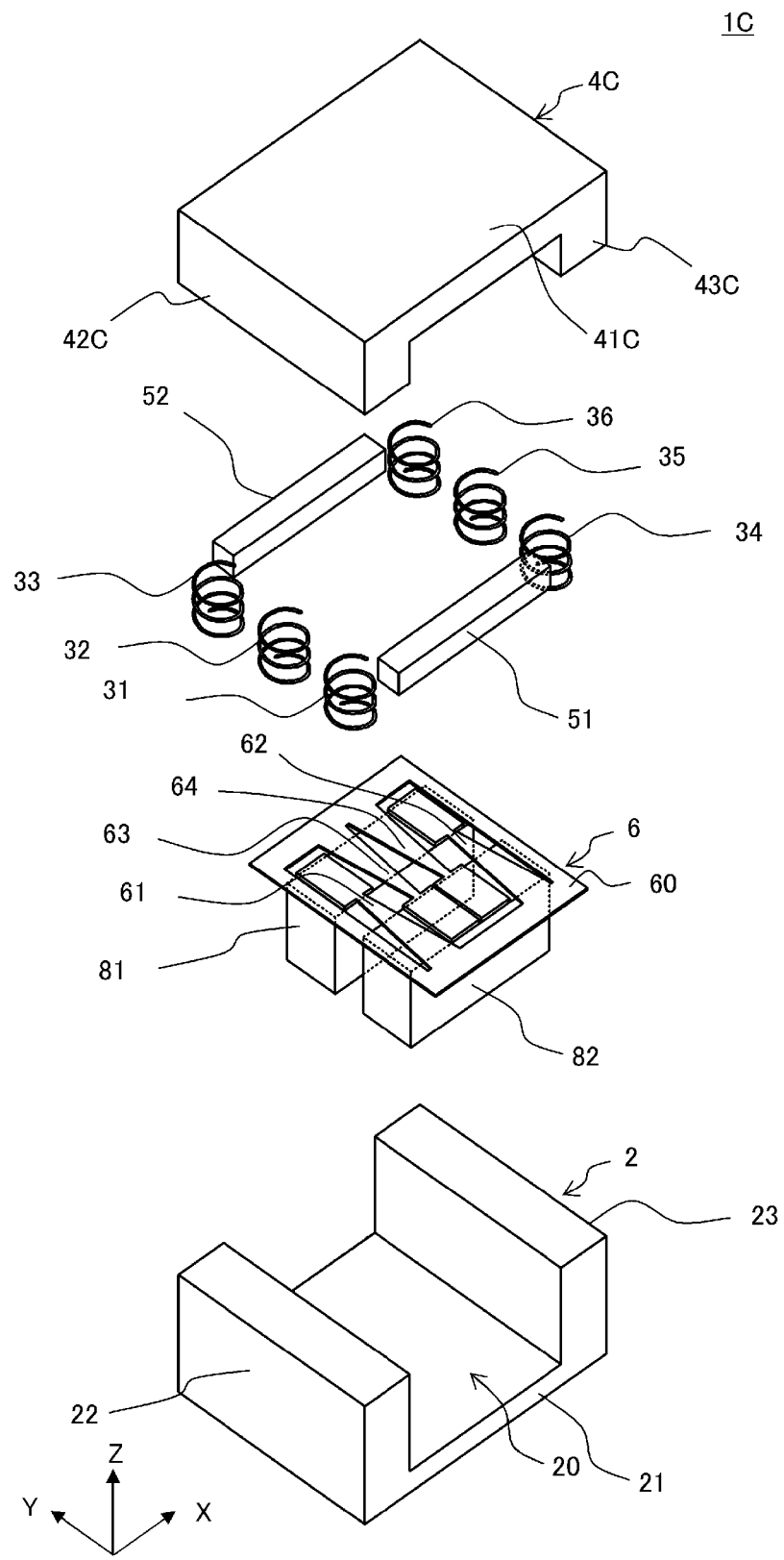
FIG. 9 is an exploded perspective view illustrating a state where a piezoelectric power generation apparatus according to a fourth embodiment of the invention is taken apart.
Figure 10:
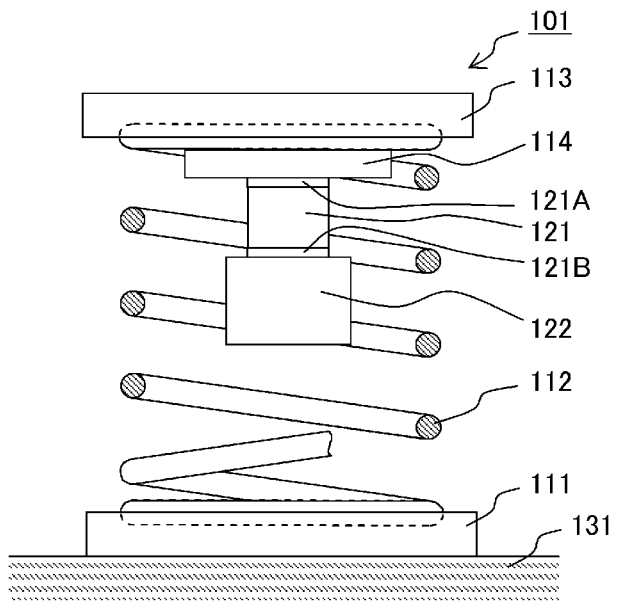
FIG. 10 is a view for explaining an example of the configuration of an existing piezoelectric power generation apparatus.

Next, a piezoelectric power generation apparatus 1C according to a fourth embodiment of the invention is described with reference to FIG. 9. FIG. 9 is an exploded perspective view illustrating a state where the piezoelectric power generation apparatus 1C according to the fourth embodiment of the invention is taken apart.

The piezoelectric power generation apparatus 1C in the embodiment include a weight plate 4C. The shape of the weight plate 4C is different from that in the piezoelectric power generation apparatus 1 in the first embodiment. Configurations other than the weight plate 4C in the piezoelectric power generation apparatus 1C are the same as those in the piezoelectric power generation apparatus 1 in the first embodiment.

The weight plate 4C includes a top board portion 41C and side wall portions 42C and 43C. The thickness direction of the top board portion 41C is the Z-axis direction and the top board portion 41C is a rectangular flat plate when seen from the above. The outer shape of the top board portion 41C is identical to the outer shape of the pedestal portion 2 when seen from the above. Each of the side wall portions 42C and 43C has a rectangular parallelepiped shape and is provided so as to be orthogonal to the lower surface (surface at the Z-axis negative direction side) of the top board portion 41C. The side wall portions 42C and 43C are provided at the lower surface (surface at the Z-axis negative direction side) side of the top board portion 41C along two sides of the top board portion 41C, which are parallel with the Y-axis, when the top board portion 41C is seen from the above.

The piezoelectric power generation apparatus 1C in the embodiment includes the weight plate 4C having the above described configuration. Therefore, the height position of the free ends of the coil springs 31 to 36 can be located at the Z-axis positive direction side relative to the height position of the fixed ends of the power generation elements 61 to 64. Accordingly, the difference (T2−T1) as described above with reference to FIG. 6 can be set to a positive value.

REFERENCE SIGNS LIST

K1 FIRST VIBRATING PORTION
K2 SECOND VIBRATING PORTION

M1 FIRST WEIGHT PORTION
M2 SECOND WEIGHT PORTION
FS VIBRATION SURFACE
CA AXIS
FE1, FE2 FREE END
CE1, CE2 FIXED END
1, 1C PIEZOELECTRIC POWER GENERATION APPARATUS
2 PEDESTAL PORTION
20 GROOVE
21 BOTTOM PLATE PORTION
22, 23 SIDE WALL PORTION
4, 4C WEIGHT PLATE
41C TOP BOARD PORTION
42C, 43C SIDE WALL PORTION
51, 52 FIXING PORTION
6, 6A, 6B POWER GENERATION PORTION
60, 60A, 60B OUTER FRAME PORTION
61, 62, 63, 64, 61A, 61B, 62B, 63B POWER GENERATION ELEMENT
62A, 63A FIXED END-SIDE BEAM PORTION
64A FREE END-SIDE BEAM PORTION
71 VIBRATING PLATE
72 PIEZOELECTRIC ELEMENT
81, 82, 81A, 81B, 82B WEIGHT PORTION

The invention claimed is:

1. A piezoelectric power generation apparatus comprising:
a first vibrating portion having a first fixed end and a first free end;
a first weight portion joined to the first free end of the first vibrating portion;
a second vibrating portion having a second fixed end joined to the first weight portion and a second free end, and including a vibrating plate and a piezoelectric element provided on the vibrating plate; and
a second weight portion joined to the second free end of the second vibrating portion,
wherein in a state where the piezoelectric power generation apparatus is arranged on a vibration surface and is still, a first position of the first free end of the first vibrating portion in an axial direction perpendicular to the vibration surface and a second position of the second fixed end of the second vibrating portion in the axial direction perpendicular to the vibration surface are different.

2. The piezoelectric power generation apparatus according to claim 1, wherein in the state where the piezoelectric power generation apparatus is arranged on the vibration surface and is still, the second position of the second fixed end of the second vibrating portion is closer to a third position of the first fixed end of the first vibrating portion in the axial direction perpendicular to the vibration surface than the first position of the first free end of the first vibrating portion.

3. The piezoelectric power generation apparatus according to claim 2, wherein in the state where the piezoelectric power generation apparatus is arranged on the vibration surface and is still, when a first distance between the third position of the first fixed end of the first vibrating portion and the first position of the first free end of the first vibrating portion is T1 and a second distance between the third position of the first fixed end of the first vibrating portion and the second position of the second fixed end of the second vibrating portion is T2 in the axial direction perpendicular to the vibration surface, a relation of $-2.1 < (T2-T1)/T1 < -0.1$ is satisfied.

4. The piezoelectric power generation apparatus according to claim 1,
wherein the first weight portion is a weight plate to which the first free end of the first vibrating portion is joined, and first and second fixing portions are provided on a surface of the weight plate,
a first part of the second vibrating portion and a first part of the second weight portion are joined to the first fixing portion, and a second part of the second vibrating portion and a second part of the second weight portion are joined to the second fixing portion,
the first part of the second weight portion joined to the first fixing portion is located at a lower side of the second fixing portion, and
the second part of the second weight portion joined to the second fixing portion is located at a lower side of the first fixing portion.

5. The piezoelectric power generation apparatus according to claim 1, wherein the first vibrating portion and the first weight portion form a first resonator, the second vibrating portion and the second weight portion form a second resonator, and, in the state where the piezoelectric power generation apparatus is arranged on the vibration surface and is active, an amplitude of the second resonator is greater than that of the first resonator.

6. The piezoelectric power generation apparatus according to claim 1, wherein the first vibrating portion comprises springs.

* * * * *